US012304924B2

(12) United States Patent
Jang et al.

(10) Patent No.: US 12,304,924 B2
(45) Date of Patent: May 20, 2025

(54) SILYLCYCLODISILAZANE COMPOUND AND METHOD FOR MANUFACTURING SILICON-CONTAINING THIN FILM USING THE SAME

(71) Applicant: DNF CO., LTD., Daejeon (KR)

(72) Inventors: Se Jin Jang, Jeju-si (KR); Sung Gi Kim, Daejeon (KR); Jeong Joo Park, Daejeon (KR); Tae Seok Byun, Daejeon (KR); Yong Hee Kwone, Cheongju-si (KR); Yeong Hun Kim, Daejeon (KR); Haengdon Lim, Daejeon (KR); Sang Yong Jeon, Sejong-si (KR); Sang Ick Lee, Daejeon (KR)

(73) Assignee: DNF CO., LTD., Daejeon (KR)

( * ) Notice: Subject to any disclaimer, the term of this patent is extended or adjusted under 35 U.S.C. 154(b) by 507 days.

(21) Appl. No.: 17/753,170

(22) PCT Filed: Aug. 13, 2020

(86) PCT No.: PCT/KR2020/010771
§ 371 (c)(1),
(2) Date: Feb. 22, 2022

(87) PCT Pub. No.: WO2021/034014
PCT Pub. Date: Feb. 25, 2021

(65) Prior Publication Data
US 2022/0275010 A1     Sep. 1, 2022

(30) Foreign Application Priority Data
Aug. 22, 2019 (KR) ................. 10-2019-0102771

(51) Int. Cl.
*C07F 7/21* (2006.01)
*C23C 16/34* (2006.01)
(Continued)

(52) U.S. Cl.
CPC .............. *C07F 7/21* (2013.01); *C23C 16/345* (2013.01); *C23C 16/401* (2013.01); *C23C 16/45536* (2013.01); *C23C 16/45553* (2013.01)

(58) Field of Classification Search
CPC ....... C07F 7/21; C23C 16/345; C23C 16/401; C23C 16/45536; C23C 16/45553; C23C 16/402
See application file for complete search history.

(56) References Cited

U.S. PATENT DOCUMENTS

2005/0163927 A1   7/2005   McSwiney et al.
2016/0326193 A1*  11/2016  Jang .................... H01L 21/0228

FOREIGN PATENT DOCUMENTS

JP    2017507908 A    3/2017
JP    2018027962 A    2/2018
(Continued)

OTHER PUBLICATIONS

Machine translation, KR-2021-0118018-A (Year: 2019).*
(Continued)

*Primary Examiner* — Michael G Miller
(74) *Attorney, Agent, or Firm* — McCoy Russell LLP

(57) ABSTRACT

Provided is a novel silylcyclodisilazane compound, a composition for depositing a silicon-containing thin film containing the same, and a method for manufacturing the silicon-containing thin film using the same, and since the silylcyclodisilazane compound of the present disclosure has high reactivity, thermal stability and high volatility, it can be used as a silicon-containing precursor, thereby manufacturing a high-quality silicon-containing thin film by various deposition methods.

14 Claims, 3 Drawing Sheets

(51) Int. Cl.
    *C23C 16/40*     (2006.01)
    *C23C 16/455*     (2006.01)

(56) References Cited

FOREIGN PATENT DOCUMENTS

| JP | 2018523753 A | | 8/2018 |
|---|---|---|---|
| KR | 2021118018 A | * | 9/2021 |

OTHER PUBLICATIONS

Wrobel, A., "Surface Free Energy of Plasma-Deposited Thin Polymer Films," Physicochemical Aspects of Polymer Surfaces, Springer, Boston, Massachusetts, 19 pages.

Wrobel, A. et al., "Hard and High-Temperature-Resistant Silicon Carbonitride Coatings Based on N-Silyl-Subtituted Cyclodisilazane Rings," Journal of the Electrochemical Society, vol. 155, No. 4, Feb. 7, 2008, 11 pages.

ISA Korean Intellectual Property Administration, International Search Report Issued in Application No. KR/2020/010771, Nov. 19, 2020, WIPO, 3 pages.

ISA Korean Intellectual Property Administration, Written Opinion of the International Searching Authority Issued in Application No. KR/2020/010771, Nov. 19, 2020, WIPO, 5 pages.

Japanese Patent Office, Office Action Issued in Application No. 2022-511326, Apr. 4, 2023, 5 pages.

* cited by examiner

SILYLCYCLODISILAZANE COMPOUND AND METHOD FOR MANUFACTURING SILICON-CONTAINING THIN FILM USING THE SAME

CROSS REFERENCE TO RELATED APPLICATIONS

The present application is a U.S. National Phase of International Application No. PCT/KR2020/010771 entitled "NOVEL SILYLCYCLODISILAZANE COMPOUND AND METHOD FOR MANUFACTURING SILICON-CONTAINING THIN FILM USING THE SAME," and filed on Aug. 13, 2020. International Application No. PCT/KR2020/010771 claims priority to Korean Patent Application No. 10-2019-0102771 filed on Aug. 22, 2019. The entire contents of each of the above-listed applications are hereby incorporated by reference for all purposes.

TECHNICAL FIELD

The present disclosure relates to a novel silylcyclodisilazane compound and a silicon-containing thin film formation using the same, and more particularly, to a novel silylcyclodisilazane compound that is thermally stable and highly volatile and is in a liquid form at room temperature and an easily handleable pressure, and a method for manufacturing a silicon-containing thin film using the same.

BACKGROUND AND SUMMARY

A silicon-containing thin film is manufactured in several forms such as a silicon film, a silicon oxide film, a silicon nitride film, a silicon carbonitride film, and a silicon oxynitride film through various deposition processes in a semiconductor field, and is applied to various fields.

In particular, the silicon oxide film and the silicon nitride film are used as an insulating film, a diffusion prevention film, a hard mask, an etch stop layer, a seed layer, a spacer, trench isolation, an intermetallic dielectric material, and a protective film layer in the manufacture of a device due to a very good blocking property and oxidation resistance. Recently, a polycrystalline silicon thin film has been used in a thin film transistor (TFT), a solar cell, or the like, and has been gradually applied in diverse fields.

Well-known representative technologies for manufacturing the silicon-containing thin film include metal organic chemical vapor deposition (MOCVD) for forming a film on a surface of a substrate by a reaction between a silicon precursor in a mixed gas form and a reaction gas or forming a film by a direct reaction of a silicon precursor in a mixed gas form onto a surface of a substrate and atomic layer deposition (ALD) for forming a film by physically or chemically adsorbing a silicon precursor in a gas form onto a surface of a substrate and then sequentially injecting a reaction gas, and various technologies for manufacturing the thin film, such as low pressure chemical vapor deposition (LPCVD), plasma-enhanced chemical vapor deposition (PECVD) and plasma-enhanced atomic layer deposition (PEALD) that use plasma capable of being deposited at a low temperature, and the like, which are technologies to which LPCVD and PECVD are applied, have been applied to a process of manufacturing the next-generation semiconductor and display element, and have been used to form an ultra-fine pattern and deposit an ultra-thin film having uniform and excellent properties in a nano-scale thickness.

The generally required characteristics of a precursor for forming the silicon-containing thin film are as follows: ① a compound in a liquid form at room temperature and normal pressure and a compound having excellent volatility, ② a compound having excellent reactivity due to high thermal stability and low activation energy in itself, ③ a compound that does not produce non-volatile by-products in a process of forming a thin film, and ④ a compound that is easily handled, transported, and stored.

Representative precursors used for forming the silicon-containing thin film are compounds in the form of silane, silane chloride, amino silane and alkoxy silane, and specific examples of these compounds include a compound in the form of silane chloride such as dichlrorosilane ($SiH_2Cl_2$) and hexachlorodisilane ($Cl_3SiSiCl_3$), trisilylamine ($N(SiH_3)_3$), bis-diethylaminosilane ($H_2Si(N(CH_2CH_3)_2)_2$) and di-isopropylaminosilane ($H_3SiN(i-C_3H_7)_2$), and the like, which are used in mass-production processes of semiconductor manufacturing and display manufacturing.

However, a technology for forming a ultra-fine thin film having a uniform thin thickness and excellent electrical properties at a desired low temperature due to miniaturization and an increase in an aspect ratio of elements due to ultra-high integration of the elements and diversification of element materials has been demanded. Therefore, a high temperature process at 600° C. or more using an existing silicon precursor, step coverage, etching properties, and physical and electrical properties of the thin film have become problems.

On the other hand, although the ultra-fine thin film having a uniform thin thickness and excellent electrical properties at a low temperature required by the element is formed, productivity has become a problem due to a low thin film formation speed. Therefore, it has been demanded to develop a new silicon precursor with improved performance.

RELATED ART DOCUMENT

Patent Document

Patent Document 1: WO2017-112732 A1
Non-Patent Document 1: Journal of The Electrochemical Society, 155 (4) K66-K76 (2008)

DISCLOSURE

Technical Problem

An object of the present disclosure is to provide a novel silylcyclodisilazane compound.

Another object of the present disclosure is to provide a silylcyclodisilazane compound having excellent cohesion at a low temperature due to high thermal stability and excellent reactivity, as a silicon precursor.

Another object of the present disclosure is to provide a composition for depositing a silicon-containing thin film containing a silylcyclodisilazane compound having high thermal stability and reactivity.

Another object of the present disclosure is to provide a method for manufacturing a silicon-containing thin film capable of forming a silicon-containing thin film having excellent physical and electrical properties such as a high deposition rate and excellent step coverage, using the composition for depositing the silicon-containing thin film.

Technical Solution

The present disclosure provides a novel silylcyclodisilazane compound that is a liquid at room temperature and has high volatile, thermal stability, and reactivity.

In one general aspect, there is provided a novel silylcyclodisilazane compound represented by the following Formula 1:

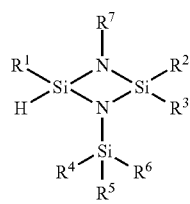

Formula 1 wherein
$R^1$ to $R^6$ are each independently hydrogen, $C_1$-$C_7$ alkyl, $C_3$-$C_7$ cycloalkyl or $C_2$-$C_7$ alkenyl; and
$R^7$ is $C_1$-$C_7$ alkyl, $C_3$-$C_7$ cycloalkyl or $C_2$-$C_7$ alkenyl.

In another general aspect, there is provided a composition for depositing a silicon-containing thin film containing a silylcyclodisilazane compound having excellent properties as a precursor for depositing a thin film and represented by the following Formula 2 as a precursor for depositing a silicon-containing thin film.

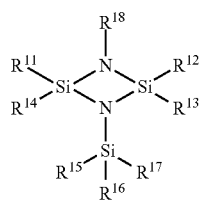

Formula 2 wherein
$R^{11}$ to $R^{17}$ are each independently hydrogen, $C_1$-$C_7$ alkyl, $C_3$-$C_7$ cycloalkyl or $C_2$-$C_7$ alkenyl;
$R^{18}$ is hydrogen, $C_1$-$C_7$ alkyl, $C_3$-$C_7$ cycloalkyl, $C_2$-$C_7$ alkenyl or —$SiR^aR^bR^c$; and
$R^a$, $R^b$ and $R^c$ are each independently hydrogen, $C_1$-$C_7$ alkyl, $C_3$-$C_7$ cycloalkyl or $C_2$-$C_7$ alkenyl;
provided that when $R^{11}$ to $R^{14}$ are all $C_1$-$C_7$ alkyl, $R^{18}$ is not —$SiR^aR^bR^c$.

In another general aspect, there is provided a method for manufacturing a silicon-containing thin film using a composition for depositing a silicon-containing thin film according to an exemplary embodiment of the present disclosure.

Advantageous Effects

The novel silylcyclodisilazane compound according to the present disclosure is a liquid at room temperature, has high volatility, has excellent thermal stability, and has low activation energy to have excellent reactivity. In addition, the novel silylcyclodisilazane compound according to the present disclosure exists in a liquid state at room temperature and a handleable pressure, and is thus easy to be handled.

Further, the composition for depositing the silicon-containing thin film according to the present disclosure includes a silylcyclodisilazane compound having high thermal stability and reactivity, and may thus have excellent physical and electrical properties such as excellent cohesion and excellent step coverage and minimizes an impurity content due to a high deposition rate under various conditions to manufacture a thin film with excellent purity and durability.

Further, in the method for manufacturing the silicon-containing thin film according to the present disclosure, it is possible to manufacture a high-quality silicon-containing thin film having high silicon content and having excellent thermal stability and durability by manufacturing a silicon-containing thin film using a composition for depositing a silicon-containing thin film including the silylcyclodisilazane compound.

The silicon-containing thin film manufactured using the silylcyclodisilazane compound according to the present disclosure as a precursor has high purity and excellent physical and electrical properties.

DETAILED DESCRIPTION

Best Mode

Figure 1:
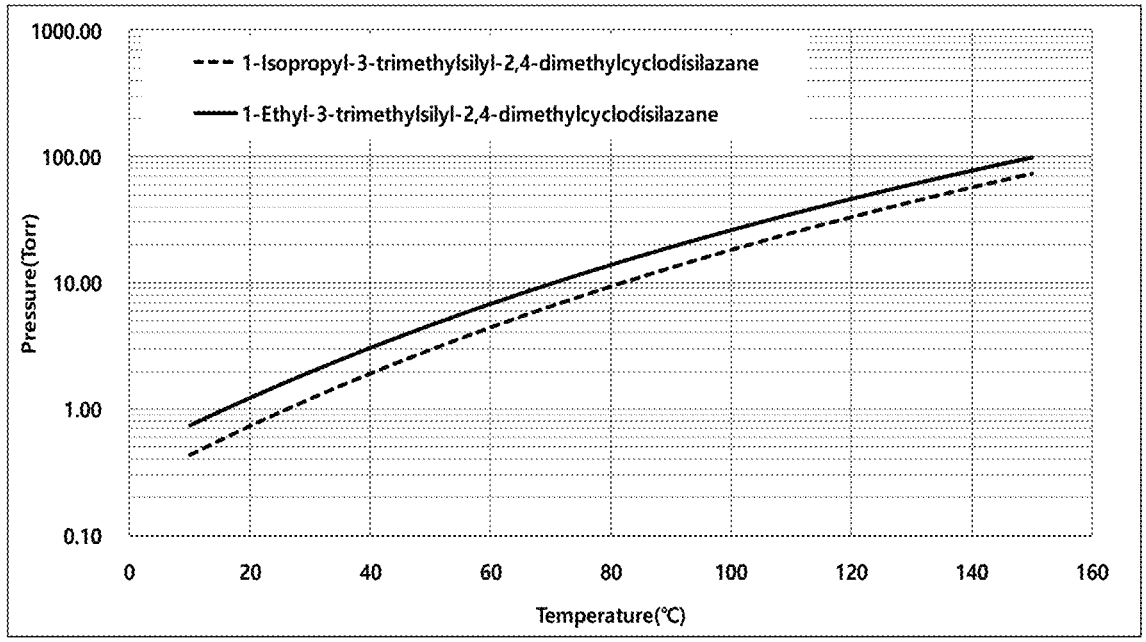
FIG. 1 is a drawing illustrating a result of measuring a vapor pressure of a silylcyclodisilazane compound prepared in Examples 2 and 4.
Figure 2:
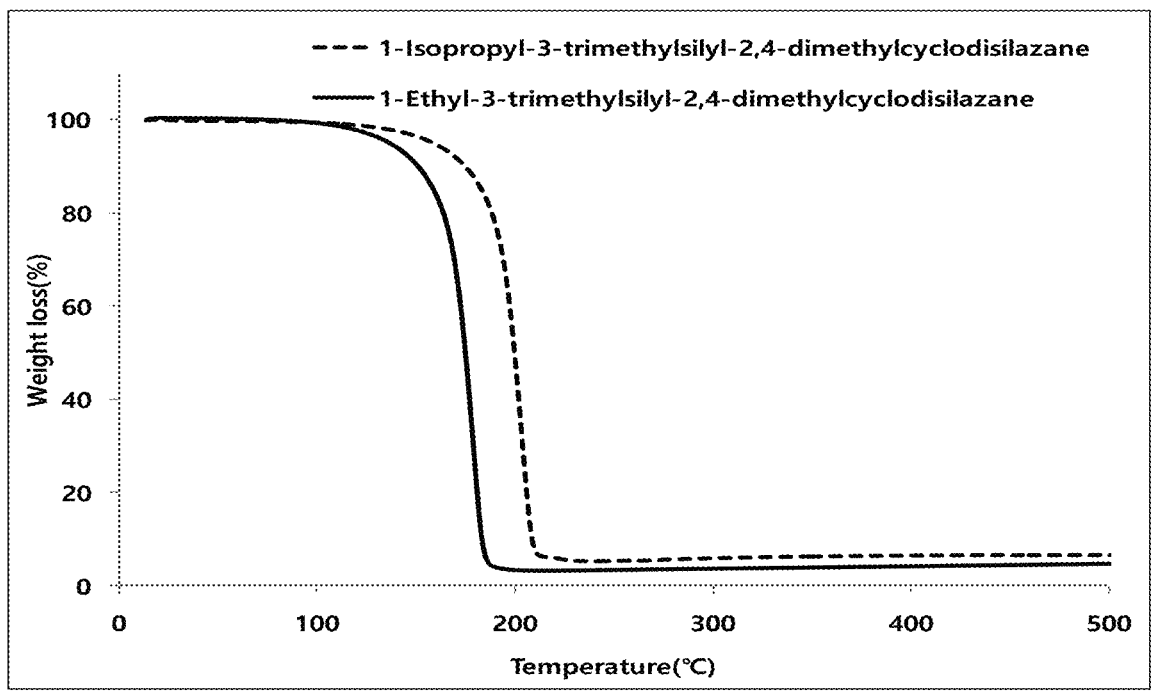
FIG. 2 is a drawing illustrating a result of thermogravimetric analysis of the silylcyclodisilazane compound prepared in Examples 2 and 4.

Hereinafter, a silylcyclodisilazane compound according to the present disclosure, a method for manufacturing thereof, and a composition for depositing a silicon-containing thin film containing the same will be described in detail.

"Alkyl" described herein refers to a linear and branched saturated hydrocarbon having 1 to 7 carbon atoms, or 1 to 5 carbon atoms, or 1 to 3 carbon atoms, and includes, for example, methyl, ethyl, propyl, isopropyl, butyl, t-butyl, isobutyl, pentyl and the like.

"Halogen" described herein refers to a halogen group element, and includes, for example, fluoro, chloro, bromo, and iodo.

The term "alkenyl" described herein, alone or as a part of another group, refers to a straight or branched chain hydrocarbon radical having 2 to 7 carbon atoms and one or more carbon to carbon double bonds. In some embodiments, the alkenyl radical is a lower alkenyl radical having 2 to 5 carbon atoms. Further, the alkenyl radical may be a radical having 2 to 3 carbon atoms. In addition, an alkenyl group may be substituted at any available point of attachment. Examples of an alkenyl radical include vinyl, propenyl, allyl, butenyl, and 4-methylbutenyl. The term "alkenyl" includes a radical having cis and trans orientation, or alternatively, E and Z orientations.

The present disclosure is to provide a novel silylcyclodisilazane compound that is very useful as a precursor for the manufacture of a silicon-containing thin film, and the silylcyclodisilazane compound according to the present disclosure is represented by the following Formula 1:

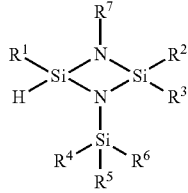

Formula 1 wherein $R^1$ to $R^6$ are each independently hydrogen, $C_1$-$C_7$ alkyl, $C_3$-$C_7$ cycloalkyl or $C_2$-$C_7$ alkenyl; and $R^7$ is $C_1$-$C_7$ alkyl, $C_3$-$C_7$ cycloalkyl or $C_2$-$C_7$ alkenyl.

The silylcyclodisilazane compound according to the present disclosure has an asymmetric form of a 4-member ring having a $Si_3N_2$ molecular skeleton, that is, an N-silylcyclodisilazane structure, wherein a silyl substituent is introduced into nitrogen atoms of cyclodisilazane and at least one hydrogen atom is introduced into silicon atoms of cyclodisilazane, which has a lower activation energy and higher thermal stability, is more reactive as a precursor for depositing a silicon-containing thin film, and does not produce non-volatile by-products. Therefore, a high-purity silicon-containing thin film may be easily formed with a high deposition rate. In addition, the silylcyclodisilazane compound has an excellent thermal stability, and thus it is possible to manufacture a thin film having high durability and excellent purity.

The silylcyclodisilazane compound according to the present disclosure is also a compound in a liquid form at room temperature and normal pressure, has excellent volatility, and has a high content of silicon atoms in a molecule, and thus may exhibit an excellent deposition rate.

In Formula 1 of the present disclosure, $R^1$ and $R^3$ may be each independently $C_1$-$C_5$ alkyl or $C_2$-$C_5$ alkenyl; $R^2$ may be hydrogen, $C_1$-$C_5$ alkyl or $C_2$-$C_5$ alkenyl; $R^4$ may be $C_1$-$C_5$ alkyl or $C_2$-$C_5$ alkenyl; $R^5$ and $R^6$ may be each independently hydrogen, $C_1$-$C_5$ alkyl or $C_2$-$C_5$ alkenyl; and $R^7$ may be $C_1$-$C_5$ alkyl or $C_2$-$C_5$ alkenyl.

In order to more usefully use the silylcyclodisilazane compound as a precursor for depositing a thin film, for instance, in Formula 1 of the present disclosure, $R^1$ and $R^3$ may be each independently $C_1$-$C_5$ alkyl; $R^2$ may be hydrogen or $C_1$-$C_5$ alkyl; $R^4$ may be $C_1$-$C_5$ alkyl; $R^5$ and $R^6$ may be each independently hydrogen or $C_1$-$C_5$ alkyl; and $R^7$ may be $C_1$-$C_5$ alkyl; or, $R^1$ and $R^3$ may be each independently $C_1$-$C_3$ alkyl; $R^2$ may be hydrogen or $C_1$-$C_3$ alkyl; $R^4$ may be $C_1$-$C_3$ alkyl; $R^5$ and $R^6$ may be each independently hydrogen or $C_1$-$C_3$ alkyl; and $R^7$ may be $C_1$-$C_3$ alkyl, or $C_2$-$C_3$ alkyl.

In a specific example, $R^1$ and $R^3$ may be each independently methyl, vinyl, isopropenyl or allyl; $R^2$ may be hydrogen, methyl, vinyl, isopropenyl or allyl; $R^4$ may be methyl, vinyl, isopropenyl or allyl; $R^5$ and $R^6$ may be each independently hydrogen, methyl, vinyl, isopropenyl or allyl; and $R^7$ may be ethyl, vinyl, isopropenyl or allyl.

In a specific example, the silylcyclodisilazane compound may be at least one selected from compounds represented by the following Formulas 1-1 to 1-4:

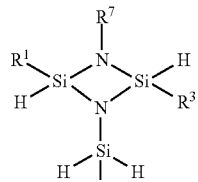

Formula 1-1

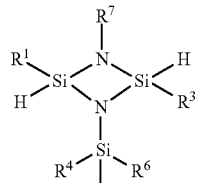

Formula 1-2

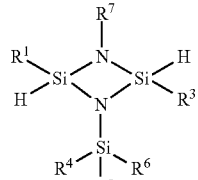

Formula 1-3

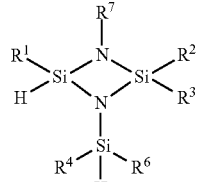

Formula 1-4 wherein $R^1$ to $R^7$ are each independently $C_1$-$C_7$ alkyl or $C_2$-$C_7$ alkenyl.

Specifically, in Formulas 1-1 to 1-4, $R^1$ to $R^7$ may be each independently $C_1$-$C_5$ alkyl or $C_2$-$C_5$ alkenyl.

Specifically, in Formulas 1-1 to 1-4, $R^1$ to $R^7$ may be each independently $C_1$-$C_5$ alkyl. Specifically, in Formulas 1-1 to 1-4, $R^1$ and $R^3$ may be each independently $C_2$-$C_5$ alkenyl; $R^2$ may be $C_1$-$C_5$ alkyl or $C_2$-$C_5$ alkenyl; and $R^4$ to $R^7$ may be each independently $C_1$-$C_5$ alkyl. Specifically, in Formulas 1-1 to 1-4, $R^1$ to $R^7$ may be each independently $C_1$-$C_3$ alkyl. Specifically, in Formulas 1-1 to 1-4, $R^1$ and $R^3$ may be each independently $C_2$-$C_3$ alkenyl; $R^2$ may be $C_1$-$C_3$ alkyl or $C_2$-$C_3$ alkenyl; and $R^4$ to $R^6$ may be each independently $C_1$-$C_3$ alkyl; and $R^7$ may be $C_2$-$C_3$ alkyl. Specifically, in Formulas 1-1 to 1-4, $R^1$ to $R^6$ may be each independently $C_1$-$C_3$ alkyl; and $R^7$ may be $C_2$-$C_3$ alkyl.

Specifically, the silylcyclodisilazane compound of Formula 1 according to the present disclosure may be selected from the following compounds, but is not limited thereto:

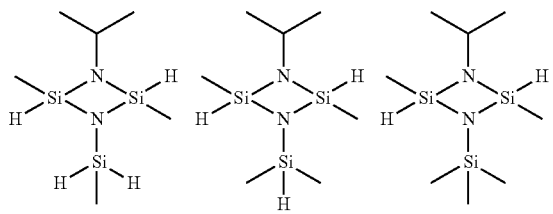

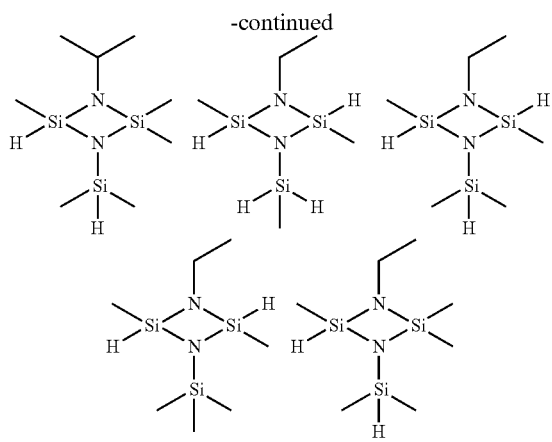

The silylcyclodisilazane compound of Formula 1 according to an exemplary embodiment of the present disclosure may be prepared through conventional organic chemical reactions known to those skilled in the art.

In addition, the present disclosure provides a composition for depositing silicon-containing thin film containing a silylcyclodisilazane compound represented by the following Formula 2 that is excellent in reactivity and thermal stability and exists mostly as a liquid at room temperature, and thus is easy to handle, as a precursor for depositing a thin film:

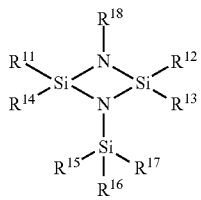

Formula 2 wherein $R^{11}$ to $R^{17}$ are each independently hydrogen, $C_1$-$C_7$ alkyl, $C_3$-$C_7$ cycloalkyl or $C_2$-$C_7$ alkenyl;

$R^{18}$ is hydrogen, $C_1$-$C_7$ alkyl, $C_3$-$C_7$ cycloalkyl, $C_2$-$C_7$ alkenyl or —$SiR^aR^bR^c$; and $R^a$, $R^b$ and $R^c$ are each independently hydrogen, $C_1$-$C_7$ alkyl, $C_3$-$C_7$ cycloalkyl or $C_2$-$C_7$ alkenyl; provided that when $R^{11}$ to $R^{14}$ are all $C_1$-$C_7$ alkyl, $R^{18}$ is not —$SiR^aR^bR^c$.

The silylcyclodisilazane compound contained in the composition for depositing a silicon-containing thin film according to the present disclosure, has a Si3N2 molecular skeleton, may control reactivity by adjusting the symmetry and asymmetry of the compound depending on a substitution group, and has a low activation energy due to a structure in which a silyl substituent is introduced into nitrogen atoms of cyclodisilazane, and thus it is possible to easily deposit a high-quality silicon-containing thin film with a high deposition rate. In addition, the silylcyclodisilazane compound of Formula 2 according to the present disclosure is a compound mainly in a liquid form at room temperature and normal pressure, has excellent volatility, and has a high content of silicon atoms in the molecule. Thus, a composition for depositing a silicon-containing thin film containing the silylcyclodisilazane compound of Formula 2 not only easily deposits a high-quality silicon-containing thin film at a high deposition rate, but may also manufacture a thin film having high durability and excellent purity due to excellent thermal stability.

In order to manufacture an excellent silicon-containing thin film, such as in the above Formula 2 according to the present disclosure, $R^{11}$ to $R^{13}$ and $R^{15}$ to $R^{17}$ may be each independently hydrogen, $C_1$-$C_7$ alkyl, $C_3$-$C_7$ cycloalkyl or $C_2$-$C_7$ alkenyl; $R^{14}$ may be hydrogen; and $R^{18}$ may be $C_1$-$C_7$ alkyl, $C_3$-$C_7$ cycloalkyl or $C_2$-$C_7$ alkenyl. In order to manufacture an excellent silicon-containing thin film, such as in Formula 2 according to the present disclosure, $R^{11}$ to $R^{14}$ may be each independently $C_1$-$C_7$ alkyl, $C_3$-$C_7$ cycloalkyl or $C_2$-$C_7$ alkenyl; $R^{15}$ to $R^{17}$ may be each independently hydrogen, $C_1$-$C_7$ alkyl, $C_3$-$C_7$ cycloalkyl or $C_2$-$C_7$ alkenyl; and $R^{18}$ may be $C_1$-$C_7$ alkyl, $C_3$-$C_7$ cycloalkyl or $C_2$-$C_7$ alkenyl.

In order to manufacture an excellent silicon-containing thin film, such as in Formula 2 according to the present disclosure, $R^{11}$ and $R^{13}$ may be each independently $C_1$-$C_7$ alkyl or $C_2$-$C_7$ alkenyl; $R^{12}$ and $R^{14}$ may be each independently hydrogen, $C_1$-$C_7$ alkyl or $C_2$-$C_7$ alkenyl; $R^{15}$ may be $C_1$-$C_7$ alkyl or $C_2$-$C_7$ alkenyl; $R^{16}$ and $R^{17}$ may be each independently hydrogen, $C_1$-$C_7$ alkyl or $C_2$-$C_7$ alkenyl; and $R^{18}$ may be $C_1$-$C_7$ alkyl or $C_2$-$C_7$ alkenyl. In some embodiments, $R^{11}$ and $R^{13}$ may be each independently $C_1$-$C_5$ alkyl; $R^{12}$ and $R^{14}$ may be each independently hydrogen or $C_1$-$C_5$ alkyl; $R^{15}$ may be $C_1$-$C_5$ alkyl; $R^{16}$ and $R^{17}$ may be each independently hydrogen or $C_1$-$C_5$ alkyl; and $R^{18}$ may be $C_1$-$C_5$ alkyl.

In order to manufacture an excellent silicon-containing thin film, such as in Formula 2 according to the present disclosure, $R^{11}$ to $R^{13}$ and $R^{15}$ to $R^{17}$ may be each independently hydrogen, $C_1$-$C_7$ alkyl, $C_3$-$C_7$ cycloalkyl or $C_2$-$C_7$ alkenyl; $R^{14}$ may be hydrogen; $R^{18}$ may be —$SiR^aR^bR^c$; $R^a$ may be $C_1$-$C_7$ alkyl or $C_2$-$C_7$ alkenyl; and $R^b$ and $R^c$ may be each independently hydrogen, $C_1$-$C_7$ alkyl or $C_2$-$C_7$ alkenyl.

In an embodiment, $R^{11}$ and $R^{13}$ may be each independently $C_1$-$C_7$ alkyl or $C_2$-$C_7$ alkenyl; $R^{12}$ may be hydrogen, $C_1$-$C_7$ alkyl or $C_2$-$C_7$ alkenyl; $R^{14}$ may be hydrogen; $R^{15}$ may be $C_1$-$C_7$ alkyl or $C_2$-$C_7$ alkenyl; $R^{16}$ and $R^{17}$ may be each independently hydrogen, $C_1$-$C_7$ alkyl or $C_2$-$C_7$ alkenyl; $R^{18}$ may be —$SiR^aR^bR^c$; $R^a$ may be $C_1$-$C_7$ alkyl or $C_2$-$C_7$ alkenyl; and $R^b$ and $R^c$ may be each independently hydrogen, $C_1$-$C_7$ alkyl or $C_2$-$C_7$ alkenyl.

In an embodiment, $R^{11}$ and $R^{13}$ may be each independently $C_1$-$C_5$ alkyl; $R^{12}$ may be hydrogen or $C_1$-$C_5$ alkyl; $R^{14}$ may be hydrogen; $R^{15}$ may be $C_1$-$C_5$ alkyl; $R^{16}$ and $R^{17}$ may be each independently hydrogen or $C_1$-$C_5$ alkyl; $R^{18}$ may be —$SiR^aR^bR^c$; $R^a$ may be $C_1$-$C_5$ alkyl; and $R^b$ and $R^c$ may be each independently hydrogen or $C_1$-$C_5$ alkyl.

In terms of a precursor for depositing thin film with more excellent properties, the silylcyclodisilazane compound of Formula 2 according to the present disclosure may be represented by the following Formula 2-1:

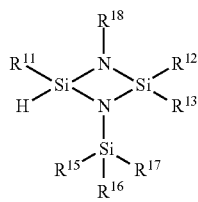

Formula 2-1 wherein $R^{11}$ and $R^{13}$ are each independently $C_1$-$C_3$ alkyl; $R^{12}$ is hydrogen or $C_1$-$C_3$ alkyl; $R^{15}$ is $C_1$-$C_3$ alkyl; $R^{16}$ and $R^{17}$ are each independently hydrogen or $C_1$-$C_3$ alkyl; $R^{18}$ is $C_1$-$C_3$ alkyl or —$SiR^aR^bR^c$; $R^a$ is $C_1$-$C_3$ alkyl; and $R^b$ and $R^c$ are each independently hydrogen or $C_1$-$C_3$ alkyl.

In an exemplary embodiment of the present disclosure, $R^{18}$ may be $C_2$-$C_3$ alkyl.

In an exemplary embodiment of the present disclosure, $R^{18}$ may be —$SiR^aR^bR^c$; $R^a$ may be $C_1$-$C_3$ alkyl; and $R^b$ and $R^c$ may be each independently hydrogen or $C_1$-$C_3$ alkyl.

In terms of a precursor for depositing a thin film with more excellent properties, the silylcyclodisilazane compound of Formula 2 according to the present disclosure may be represented by the following Formula 2-2:

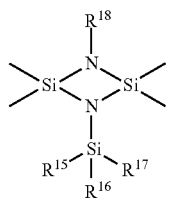

Formula 2-2 wherein $R^{15}$ is $C_1$-$C_3$ alkyl; $R^{16}$ and $R^{17}$ are each independently hydrogen or $C_1$-$C_3$ alkyl; and $R^{18}$ is $C_1$-$C_3$ alkyl.

In an exemplary embodiment of the present disclosure, $R^{18}$ may be $C_2$-$C_3$ alkyl.

Specifically, the silylcyclodisilazane compound according to the present disclosure may be selected from the following compounds, but is not limited thereto:

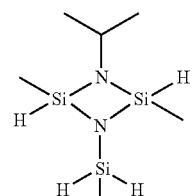

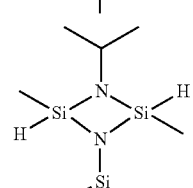

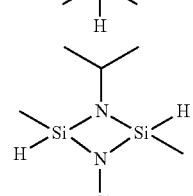

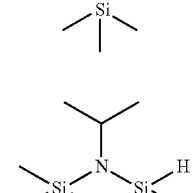

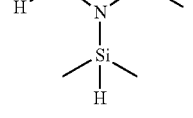

-continued

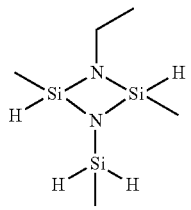

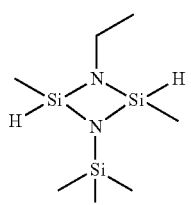

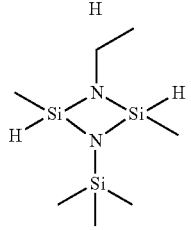

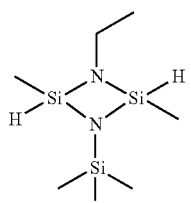

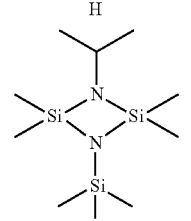

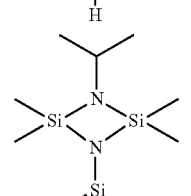

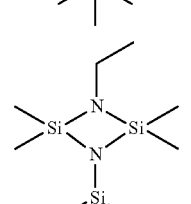

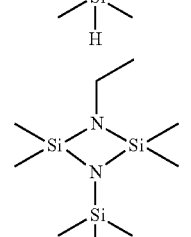

-continued

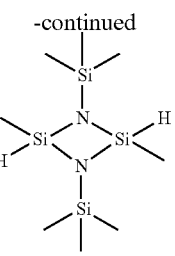

The composition for depositing a silicon-containing thin film according to the present disclosure necessarily includes the silylcyclodisilazane compound of Formula 2 above as a precursor, and may include one or more silylcyclodisilazane compounds, and the content of the silylcyclodisilazane compound in the composition for depositing a silicon-containing thin film may be included within a range recognized by those skilled in the art, considering conditions for the film formation of the thin film, or thickness and characteristics of the thin film.

In addition, the present disclosure provides a method for manufacturing a silicon-containing thin film using the composition for depositing a silicon-containing thin film according to the present disclosure.

The method for manufacturing the silicon-containing thin film according to an exemplary embodiment may manufacture a thin film using the composition for depositing the silicon-containing thin film according to the present disclosure, containing a silylcyclodisilazane compound of Formula 2 above that is a liquid at room temperature and has high volatility and excellent thermal stability, as a precursor, and thus, it is possible to manufacture a high-purity silicon-containing thin film that is easy to handle the precursor, is capable of manufacturing the silicon-containing thin film under various conditions, has high silicon content and deposition rate, and has excellent step coverage.

The silicon-containing thin film according to an exemplary embodiment may be any thin film which may be manufactured within the scope recognized by those skilled in the art. Specifically, the silicon-containing thin film may be a silicon oxide ($SiO_2$) film, a silicon oxycarbide (SiOC) film, a silicon nitride (SiN) film, a silicon oxynitride (SiON) film, a silicon carbonitride (SiCN) film, or a silicon carbide (SiC) film, or the like, and besides, various high-quality thin films containing silicon may be manufactured within the scope recognized by those skilled in the art.

The method for manufacturing the silicon-containing thin film according to an exemplary embodiment may be any method within the scope recognized by those skilled in the art, and the method may be performed by atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD), or plasma-enhanced atomic layer deposition (PEALD). In order for the thin film to be easily deposited and for the manufactured thin film to have excellent properties, plasma-enhanced atomic layer deposition (PEALD) or plasma-enhanced chemical vapor deposition (PECVD) may be used.

The method for manufacturing a silicon-containing thin film according to an exemplary embodiment may specifically include: a) heating and maintaining a temperature of a substrate mounted in a chamber to 30 to 400° C.; b) contacting the substrate with a composition for depositing a silicon-containing thin film according to an exemplary embodiment of the present disclosure to adsorb on the substrate; and c) injecting reaction gas to deposit a silicon-containing thin film on the substrate.

In some embodiments, when the manufacture of the silicon-containing thin film according to an exemplary embodiment of the present disclosure are performed by plasma-enhanced atomic layer deposition (PEALD) or plasma-enhanced vapor deposition (PECVD), the method may further include, after step a), generating a plasma. In addition, in step b), the composition for depositing the silicon-containing thin film may be injected with a carrier gas.

In the method for manufacturing a silicon-containing thin film according to an exemplary embodiment, deposition conditions may be adjusted depending on the desired structure or thermal properties of the thin film. As deposition conditions according to an exemplary embodiment, an input flow rate of the composition for depositing the silicon-containing thin film containing the silylcyclodisilazane compound, reaction gas, an input flow rate of carrier gas, pressure, RF power, a substrate temperature and the like may be exemplified, and as a non-limited example of the deposition conditions, an input flow rate of the composition for depositing the silicon-containing thin film of 10 to 1000 cc/min, a carrier gas of 10 to 1000 cc/min, a flow rate of the reaction gas of 1 to 1000 cc/min, a pressure of 0.5 to 10 torr, an RF power of 200 to 1000 W, and a substrate temperature of 30 to 400° C., or 100 to 350° C. may be adjusted within the range, but are not limited thereto.

The reaction gas used in the method for manufacturing the silicon-containing thin film according to an exemplary embodiment, may be used as long as it is a gas usually used together with a silicon precursor considering the material of the silicon-containing thin film to be manufactured. Specific examples of the reaction gas may include, but are not limited to, any one or two or more selected from oxygen ($O_2$), Ozone ($O_3$), distilled water ($H_2O$), hydrogen peroxide ($H_2O_2$), nitrogen monoxide (NO), nitrous oxide ($N_2O$), nitrogen dioxide ($NO_2$), ammonia ($NH_3$), nitrogen ($N_2$), hydrazine ($N_2H_4$), amine, diamine, carbon monoxide (CO), carbon dioxide ($CO_2$), $C_1$-$C_{12}$ saturated or unsaturated hydrocarbon, hydrogen, argon and helium. Examples of the carrier gas may include, but are not limited to, one or two or more selected from argon, helium, and nitrogen.

The substrate used in the method for manufacturing the silicon-containing thin film according to an exemplary embodiment may be a substrate including one or more semiconductor materials among Si, Ge, SiGe, GaP, GaAs, SiC, SiGeC, InAs and InP; a silicon on insulator (SOI) substrate; a quartz substrate; or a glass substrate for display; a flexible plastic substrate such as polyimide, polyethylene terephthalate (PET), polyethylene naphthalate (PEN), polymethyl methacrylate (PMMA), polycarbonate (PC), polyethersulfone (PES) and polyester, but is not limited thereto.

Further, in addition to the silicon-containing thin film being directly formed on the substrate, a plurality of conductive layers, dielectric layers, insulating layers, or the like may be formed between the substrate and the silicon-containing thin film.

Hereinafter, the present disclosure will be described in detail by the following Examples. Prior to that, terms and words used in the present specification are not to be construed as a general or dictionary meaning but are to be construed as meaning and concepts meeting the technical ideas of the present disclosure based on a principle that the inventors can appropriately define the concepts of terms in order to describe their own disclosures in best mode.

Therefore, the configurations illustrated in the Examples and drawings described herein are merely the exemplary embodiment of the present disclosure but do not represent all of the technical spirit of the present disclosure. Thus, it should be understood that there are various equivalents and modified examples to replace these at the time of filing the present application.

In addition, the following examples were all carried out by the known plasma-enhanced atomic layer deposition (PEALD) using commercially available 200 mm single wafer type ALD equipment (CN1, Atomic Premium) in a shower head mode. In addition, it may be carried out by known plasma-enhanced chemical vapor deposition (PECVD) using commercially available 200 mm single wafer type CVD equipment (CN1, Atomic Premium) in a shower head mode.

The deposited silicon-containing thin film was measured for its thickness using an ellipsometer (OPTI-PROBE 2600, THERMA-WAVE), and thin film characteristics were analyzed using an infrared spectroscopy (IFS66V/S & Hyperion 3000, Bruker Optics) and an X-ray photoelectron spectroscopy.

Example 1: Synthesis of 1-isopropyl-3-dimethylsilyl-2,2,4-trimethylcyclodisilazane Under an anhydrous and inert atmosphere, 150 g (1.59 mol) of chlorodimethylsilane ($SiH(CH_3)_2Cl$) and 800 g (11.1 mol) of n-pentane were added to a flame-dried 2000 mL flask, and 187.4 g (3.17 mol) of isopropylamine (($CH_3)_2CHNH_2$) was slowly added thereto while maintaining at −25° C., followed by stirring for 3 hours. After the completion of stirring, an isopropylamine hydrochloride salt (($CH_3)_2$ $CHNH_3Cl$) was removed by filtration, and n-pentane was removed from the obtained filtrate under reduced pressure. Tetrahydrofuran (THF) was added to the recovered dimethylsilylisopropylamine ($SiH(CH_3)_2NHCH(CH_3)_2$) and 394 g (1.34 mol) of 21.78% n-butyllithium was slowly added thereto while maintaining at −25nd 394 g (1.34 mol) of 21.78% n-butyllithium was slowly added thereto while maintaining educed pressure. Tetrahydrofuran (THF) was added to the recovered dimethylsilylisopropylamine (SiH(CHctroscopy (IFS66V/S & Hyperion $Si(CH_3)_2Cl_2$) was slowly added while maintaining at −25° C. After the completion of adding, the reaction solution was slowly raised to room temperature and stirred at room temperature for 6 hours. After the completion of stirring, the resulting lithium chloride salt (LiCl) was removed by filtration, and tetrahydrofuran (THF) was removed from the obtained filtrate under reduced pressure. Recovered dimethylsilyldimethylchlorosilyl isopropylamine ($SiH(CH_3)_2NCH(CH_3)_2Si(CH_3)_2Cl$) was mixed with n-pentane, and then 41.08 g (2.41 mol) of ammonia ($NH_3$) was slowly added with stirring at −25° C. After the completion of adding, the reaction solution was slowly raised to room temperature and stirred at room temperature for 6 hours. After the completion of stirring, the resulting ammonium chloride salt ($NH_4Cl$) was removed by filtration, and n-pentane was removed from the obtained filtrate under reduced pressure. Recovered (dimethylsilyl)(aminodimethylsilyl) isopropylamine ($SiH(CH_3)_2NCH(CH_3)_2Si(CH_3)_2NH_2$) was mixed with tetrahydrofuran, 349.06 g (1.19 mol) of 21.78% n-butyllithium was slowly added thereto with stirring at −25° C., and after stirring for 3 hours, 135.95 g (1.18 mol) of dichloromethylsilane ($SiH(CH_3)Cl_2$) was slowly added with stirring at −25° C. After the completion of adding, the reaction solution was slowly raised to room temperature and stirred at room temperature for 6 hours. After the completion of stirring, the resulting lithium chloride salt (LiCl) was removed by filtration, tetrahydrofuran (THF) was removed from the obtained filtrate under reduced pressure, followed by distillation under reduced pressure to obtain 75 g (0.32 mol) of 1-isopropyl-3-dimethylsilyl-2,2,4-trimethylcyclodisilazane ($Si(CH_3)_2NCH(CH_3)_2SiHCH_3NSiH(CH_3)_2$) (yield 54%).

$^1$H-NMR ($C_6D_6$): δ 0.16 (d, 6H ($NSiH(CH_3)_2$), 0.28 (d, 6H (N,N—$Si(CH_3)_2$), 0.32 (s, 3H (N,N—$SiHCH_3$)), 1.00 (d, 6H ($NCH(CH_3)_2$), 3.21 (m, 1H (—NCH)), 4.75 (m, 1H ($NSi\underline{H}(CH_3)_2$), 5.50 (s, 1H (N,N—$SiHCH_3$).

Example 2: Synthesis of 1-isopropyl-3-trimethylsilyl-2,4-dimethylcyclodisilazane Under an anhydrous and inert atmosphere, 535 g (1.61 mol) of bis(dimethylaminomethylsilyl)trimethylsilylamine ((($CH_3)_2N(CH_3)HSi)_2NSi(CH_3)_3$) and 732 g (10.15 mol) of n-pentane were added to a flame-dried 2000 mL flask, and 292.3 g (8.12 mol) of hydrogen chloride (HCl) was slowly added thereto while maintaining at −40° C., followed by stirring for 3 hours. A dimethylamine hydrochloride salt (($CH_3)_2NH_2Cl$) was removed by filtration, and n-pentane was removed from the obtained filtrate under reduced pressure. The recovered bis(chloromethylsilyl)trimethylsilylamine (($ClCH_3)HSi)_2NSi(CH_3)_3$) was mixed with n-pentane, and then 240.91 g (4.03 mol) of isopropylamine (($CH_3)_2CHNH_2$) was added slowly while maintaining at −25° C., with stirring. After the completion of adding, the reaction solution was slowly raised to room temperature and stirred at room temperature for 3 hours. After stirring, an isopropylamine hydrogen chloride salt (($CH_3)_2CHNH_3Cl$) was removed by filtration. A solution of recovered (chloromethylsilyl) (isopropylaminomethylsilyl)trimethylsilylamine (($ClCH_3)HSi)(($CH_3)_2CHNH(CH_3)HSi)NSi(CH_3)_3$) was slowly added to 518.9 g (1.35 mol) of 1.70 M t-butyllithium while maintaining at −25° C. After the completion of adding, the reaction solution was slowly raised to room temperature, and then stirred at room temperature for 6 hours. After the completion of stirring, the resulting lithium chloride salt (LiCl) was removed by filtration, the solvent was removed from the obtained filtrate under reduced pressure, followed by distillation under reduced pressure to obtain 103 g (0.44 mol) of 1-isopropyl-3-trimethylsilyl-2,4-dimethylcyclodisilazane ($Si(CH_3)_3N(SiH(CH_3))_2NCH(CH_3)_2$) (yield 32%).

$^1$H -NMR ($C_6D_6$): δ 0.10 (s, 9H (NSi—($CH_3)_3$), 0.33 (d, 6H (N,N—$SiH(CH_3)$)), 1.00 (d, 6H, ($NCH(CH_3)_2$), 3.15 (m, 1H (—NCH)), 5.49 (s, 1H (N,N—$Si\underline{H}(CH_3)$), 5.52 (s, 1H (N,N—$SiH(CH_3)$)).

Example 3: Synthesis of 1-isopropyl-3-methylsilyl-2,4-dimethylcyclodisilazane Under an anhydrous and inert atmosphere, 350 g (1.26 mol) of tris(dimethylaminomethylsilyl)amine ((($CH_3)_2NSiHCH_3)_3N$) and 725.07 g (10.05 mol) of n-pentane were added to a flame-dried 2000 mL flask, and 263.8 g (7.54 mol) of hydrogen chloride (HCl) was slowly added thereto while maintaining at −40° C., followed by stirring for 3 hours. A dimethylamine hydrochloride salt (($CH_3)_2CHNH_3Cl$) was removed by filtration, and n-pentane was removed from the obtained filtrate under reduced pressure. Recovered tris(chloromethylsilyl)amine (($ClCH_3SiH)_3N$) was mixed with n-pentane, and 148.51 g (2.51 mol) of isopropylamine (($CH_3)_2CHNH_2$)) was slowly added while maintaining at −25° C., with stirring. After the completion of adding, the reaction solution was slowly raised to room temperature and stirred at room temperature for 3 hours. After the completion of stirring, the isopropylamine hydrochloride salt ($(CH_3)_2CHNH_3Cl$) was removed by filtration. A solution of recovered [bis(chloromethylsilyl)](isopropylaminomethylsilyl) amine (($ClCH_3SiH)_2((CH_3)_2CHNHCH_3SiH)N$) was slowly added to 481.79 g (1.26 mol) of 1.70 M t-butyllithium while maintaining at −25° C. After the completion of adding, the reaction solution was slowly raised to room temperature, and then stirred at room temperature for 6 hours. After the completion of stirring, the resulting lithium chloride salt (LiCl) was removed by filtration. The solvent was removed from the obtained filtrate under reduced pressure, mixed with tetrahydrofuran (THF), and then 14.98 g (1.88 mol) of lithium hydride (LiH) was added at room temperature with stirring, followed by stirring for 3 hours. The resulting lithium chloride salt (LiCl) was removed by filtration. The obtained filtrate was distilled under reduced pressure to obtain 103 g (0.5 mol) of 1-isopropyl-3-methylsilyl-2,4-dimethylcyclodisilazane ($SiH_2CH_3N(SiHCH_3)_2NCH(CH_3)_2$) (yield 40%).

$^1$H-NMR ($C_6D_6$): δ 0.15 (t, 3H ($NSiH_2(CH_3)$)), 0.28 (s, 6H (N,N—$SiH(CH_3)$)), 0.98 (d, 6H, ($NCH(CH_3)_2$), 3.2 (m, 1H ($NCH(CH_3)$)), 5.47 (m, 2H ($SiH(CH_3)$)), 4.6 (m, 2H $NSiH_2(CH_3)$)).

Example 4: Synthesis of 1-ethyl-3-trimethylsilyl-2,4-dimethylcyclodisilazane

Under an anhydrous and inert atmosphere, 535 g (2.03 mol) of bis(dimethylaminomethylsilyl)trimethylsilylamine ($((CH_3)_2N(CH_3HSi)_2NSi(CH_3)_3$) and 732 g (10.15 mol) of n-pentane were added to a flame-dried 2000 mL flask, and 292.3 g (8.12 mol) of hydrogen chloride (HCl) was slowly added while maintaining at −40° C., followed by stirring for 3 hours. A dimethylamine hydrochloride salt ($(CH_3)_2NH_2Cl$) was removed by filtration, and n-pentane was removed from the obtained filtrate under reduced pressure. The recovered bis(chloromethylsilyl)trimethylsilylamine (($ClCH_3)HSi)_2NSi(CH_3)_3$) was mixed with n-pentane, and then 136.6 g (3.03 mol) of ethylamine ($CH_3CH_2NH_2$) was added slowly while maintaining at −25° C., with stirring. After the completion of adding, the reaction solution was slowly raised to room temperature and stirred at room temperature for 3 hours. After stirring, an ethylamine hydrogen chloride salt ($CH_3CH_2NH_3Cl$) was removed by filtration. A solution of recovered (chloromethylsilyl) (ethylaminomethylsilyl)trimethylsilylamine (($Cl(CH_3)HSi)((CH_3CH_2NH(CH_3)HSi)NSi(CH_3)_3$) was slowly added to 547.49 g (1.43 mol) of 1.70 M t-butyllithium while maintaining at −25° C. After the completion of adding, the reaction solution was slowly raised to room temperature, and then stirred at room temperature for 6 hours. After the completion of stirring, the resulting lithium chloride salt (LiCl) was removed by filtration, the solvent was removed from the obtained filtrate under reduced pressure, followed by distillation under reduced pressure to obtain 258 g (1.18 mol) of 1-ethyl-3-trimethylsilyl-2,4-dimethylcyclodisilazane ($Si(CH_3)_3N(SiH(CH_3))_2)N(CH_2CH_3)$) (yield 83%).

$^1$H-NMR ($C_6D_6$): δ 0.10 (s, 9H (NSi—$(CH_3)_3$), 0.28 (d, 6H (N,N—$SiH(CH_3)$), 0.99 (t, 2H ($NCH_2CH_3$), 2.74 (q, 3H ($NCH_2CH_3$)), 5.48 (d, 1H (N,N—$SiH(CH_3)$), 5.50 (s, 1H (N,N—$SiH(CH_3)$)).

Example 5: Deposition of Silicon Oxide Film by Plasma-Enhanced Atomic Layer Deposition (PEALD) Using Silylcyclodisilazane Compound Film formation evaluation was performed using the silylcyclodisilazane compound according to the present disclosure as a composition for the formation of a silicon oxide film in a conventional plasma-enhanced atomic layer deposition (PEALD) apparatus using a known plasma-enhanced atomic layer deposition (PEALD). Oxygen was used together with plasma as a reaction gas, and argon, which is an inert gas, was used for purging purpose.

Specific methods for depositing the silicon oxide film are shown in Table 1 below.

TABLE 1

| | | Deposition conditions of silicon oxide film | | |
|---|---|---|---|---|
| | | Precursor structure | | |
| | | 1-isopropyl-3-trimethylsilyl-2,4-dimethylcyclodisilazane (Example 2) | 1-isopropyl-3-trimethylsilyl-2,2,4,4-tetramethylcyclodisilazane | 1,3-bis(trimethylsilyl)-2,4-dimethylcyclodisilazane |
| Substrate temperature (° C.) | | 100 | 100 | 100 |
| Precursor | Heating temperature (° C.) | 42 | 58 | 53 |
| | Injection time(sec) | 0.1 | 0.1 | 0.1 |
| Purge | Flow rate(sccm) | 600 | 600 | 600 |
| | Time(sec) | 0.4 | 0.4 | 0.4 |
| 400 W Oxygen plasma | Flow rate(sccm) | 500 | 500 | 500 |
| | Time(sec) | 1 | 1 | 1 |
| Purge | Flow rate(sccm) | 600 | 600 | 600 |
| | Time(sec) | 0.4 | 0.4 | 0.4 |
| Number of depositions | Cycle | 100 | 100 | 100 |

Figure 3:
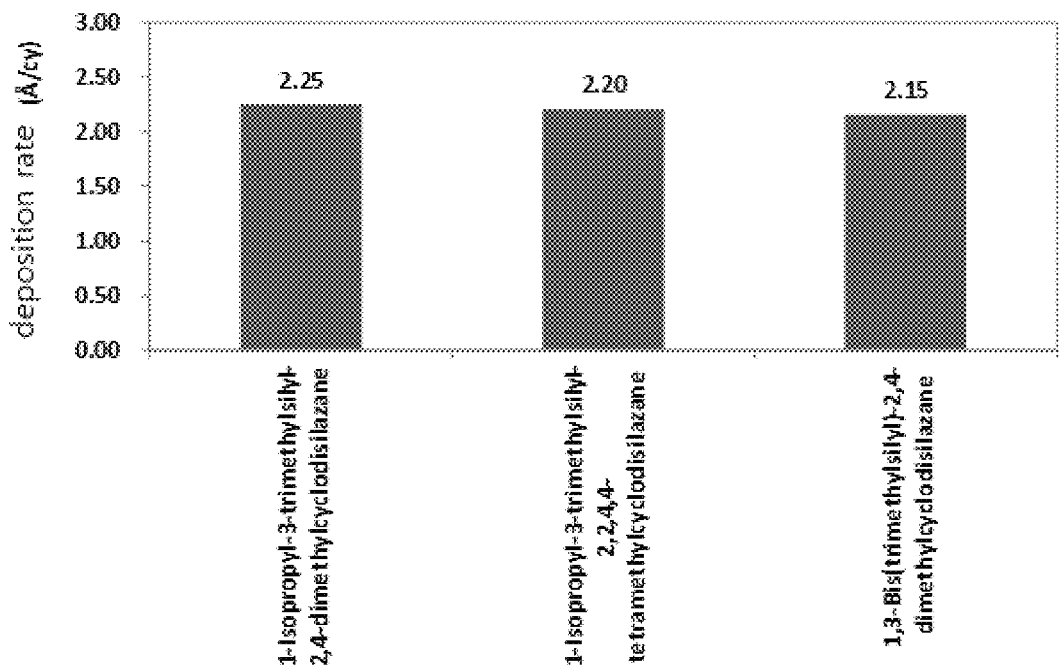
FIG. 3 is a drawing illustrating a result of a deposition rate of the silicon oxide film manufactured in Example 5.
Figure 4:
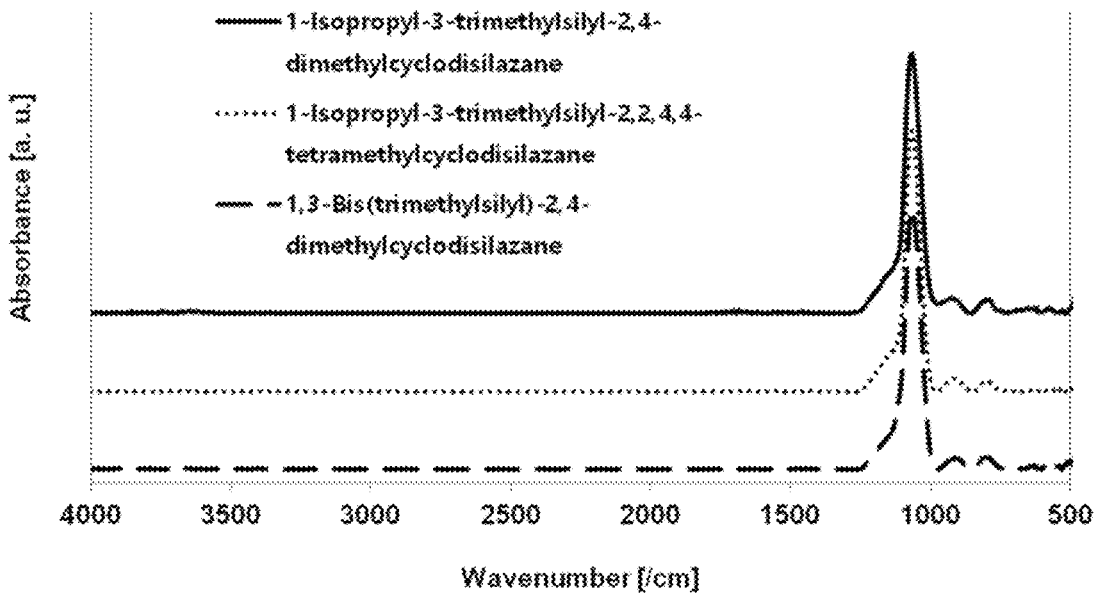
FIG. 4 is a drawing illustrating a result of FT-IR analysis of the silicon oxide film manufactured in Example 5.

The deposited thin film was measured for its thickness using an ellipsometer, and the formation of $SiO_2$ thin film was analyzed using an infrared spectrophotometer. FIG. 3 illustrates deposition rates of the silicon oxide films through an ellipsometer analysis, and shows the thickness of the films. When depositing a silicon oxide film using the silylcyclodisilazane compound according to the present disclosure as a precursor, the thickness of the thin film was 215 to 225 Å in the range of 2.15 to 2.25 Å/cycle based on the deposition cycle. Thus, it is determined that the silylcyclodisilazane compound according to the present disclosure may be usefully used to all fields of the application of the silicon oxide thin film that require a high deposition rate as the precursor for depositing the silicon oxide film. FIG. 4 is a result of analyzing the formation of the deposited silicon oxide film using an infrared spectrometer, and illustrates that all of the deposited thin films formed the silicon oxide film and no impurity peaks such as C—H and Si—OH were observed [(top) 1-isopropyl-3-trimethylsilyl-2,4-dimethylcyclodisilazane; (middle) 1-isopropyl-3-trimethylsilyl-2,2,4,4-tetramethylcyclodisilazane; (bottom) 1,3-bis(trimethylsilyl)-2,4-dimethylcyclodisilazane].

The composition of the deposited silicon oxide film was also analyzed using an X-ray photoelectron spectroscopy, and the results are shown in Table 2 below. As shown in Table 2 below, it could be confirmed that a ratio of oxygen and silicon in the thin film deposited using the silylcyclodisilazane compound according to the present disclosure as the precursor was 2 (67:33), and that a content of carbon and nitrogen was 0%, thereby forming a high-purity silicon oxide thin film.

TABLE 2

Components of silicon oxide film using X-ray photoelectron spectroscopy

| Precursor | Atomic components (%) | | | | Si/O ratio |
|---|---|---|---|---|---|
| | Si | O | C | N | |
| 1-isopropyl-3-trimethylsilyl-2,4-dimethylcyclodisilazane | 66.8 | 33.2 | 0.0 | 0.0 | 2.0 |
| 1-isopropyl-3-trimethylsilyl-2,2,4,4-tetramethylcyclodisilazane | 67.1 | 32.9 | 0.0 | 0.0 | 2.0 |
| 1,3-bis(trimethylsilyl)-2,4-dimethylcyclodisilazane | 67.0 | 33.0 | 0.0 | 0.0 | 2.0 |

That is, the silylcyclodisilazane compound according to the present disclosure forms a high-purity silicon oxide thin film with a high deposition rate by a plasma atomic layer deposition process, which has been confirmed to have high utilization value.

Example 6: Deposition of Silicon Nitride Film by Plasma-Enhanced Atomic Layer Deposition (PEALD) Using Silylcyclodisilazane Compound Film formation evaluation was performed using a 1-isopropyl-3-trimethylsilyl-2,4-dimethylcyclodisilazane compound as a composition for the formation of a silicon nitride film in a conventional plasma-enhanced atomic layer deposition (PEALD) apparatus using a known plasma-enhanced atomic layer deposition (PEALD). Nitrogen was used as the reaction gas and a purge gas.

A silicon substrate was maintained at a temperature of 350° temperature of 350 was maintained at a tem,4-dimethylcyclodisilazane compound was charged into a stainless steel bubbler container and maintained at a temperature of 58° C. First, the silicon precursor compound vaporized in the stainless steel bubbler container was transferred to the silicon substrate using nitrogen gas (50 sccm) as a carrier gas to be adsorbed on the silicon substrate. Second, the silicon precursor compound that has not been adsorbed for about 32 seconds was removed using nitrogen gas (6000 sccm). Third, the silicon nitride film was formed by applying 75 W plasma for 60 seconds under a nitrogen gas (6000 sccm) condition. Finally, reaction by-products and residual reaction gases were removed for about 20 seconds using nitrogen gas (6000 sccm). The above processes become one cycle and this cycle is repeated several times to form a silicon nitride thin film.

A specific method for depositing the silicon nitride film is shown in Table 3 below.

TABLE 3

Deposition conditions of silicon nitride film

| | | Precursor structure 1-isopropyl-3-trimethylsilyl-2,4-dimethylcyclodisilazane |
|---|---|---|
| Substrate temperature (° C.) | | 350 |
| Precursor | Heating temperature (° C.) | 58 |
| | Injection time (sec) | 5 |
| Purge | Flow rate (sccm) | 6000 |
| | Time (sec) | 32 |
| 75 W nitrogen Plasma | Flow rate (sccm) | 6000 |
| | Time (sec) | 60 |
| Purge | Flow rate (sccm) | 6000 |
| | Time (sec) | 20 |
| Number of deposition | Cycle | 240 |

The deposited silicon nitride thin film was measured for its thickness and refractive index using an ellipsometer, and the formation of the silicon nitride film and the components of the thin film were analyzed using an infrared spectrophotometer and an X-ray photoelectron spectrometry.

Upon analysis of the ellipsometer, the thickness of the thin film was 112 Å during 240 cycles on the flat wafer, and the growth rate was 0.47 Å per cycle. In addition, the refractive index was 2.0, showing the characteristics of the silicon nitride thin film.

Figure 5:
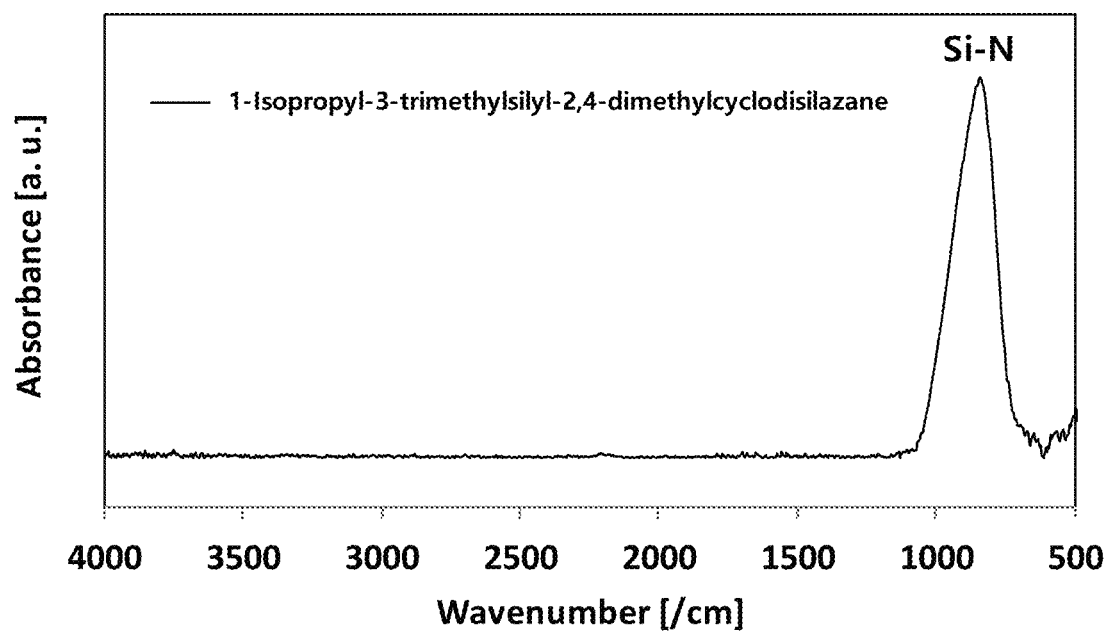
FIG. 5 is a drawing illustrating a result of FT-IR analysis of a silicon nitride film manufactured in Example 6.

In addition, as illustrated in FIG. 5, upon analysis of the infrared spectrophotometry, Si—N bond was identified, and only a small amount of Si—H peak was observed. The composition of the thin film analyzed by X-ray photoelectron spectroscopy is shown in Table 4. As a result, it could be confirmed that the silicon nitride film was formed at a ratio of silicon/nitrogen in the thin film of 0.72, which is close to the ideal silicon nitride thin film.

TABLE 4

Component of silicon nitride thin film using X-ray photoelectron spectroscopy

| Atomic components (%) | | | | Si/N |
|---|---|---|---|---|
| Si | N | O | C | |
| 41.4 | 57.5 | 1.1 | 0.0 | 0.72 |

That is, it was confirmed that the silylcyclodisilazane compound according to the present disclosure has a high utilization value in forming a high-purity silicon nitride thin film through a plasma atomic layer deposition process.

The foregoing description of the present disclosure is for illustrative exemplary purposes only, and those of ordinary skill in the art to which the present disclosure pertains will appreciate that modifications can be easily made to other specific forms without changing the technical spirit or essential features of the present disclosure. Therefore, it should be understood that the embodiments described above are illustrative in all respects and not restrictive.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A silylcyclodisilazane compound represented by the following Formula 1:

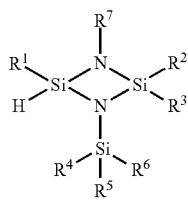

Formula 1 wherein $R^1$ to $R^6$ are each independently hydrogen, $C_1$-$C_7$ alkyl, $C_3$-$C_7$ cycloalkyl or $C_2$-$C_7$ alkenyl; and $R^7$ is $C_1$-$C_7$ alkyl, $C_3$-$C_7$ cycloalkyl or $C_2$-$C_7$ alkenyl.

2. The silylcyclodisilazane compound of claim 1, wherein $R^1$ and $R^3$ are each independently $C_1$-$C_5$ alkyl or $C_2$-$C_5$ alkenyl;

$R^2$ is hydrogen, $C_1$-$C_5$ alkyl or $C_2$-$C_5$ alkenyl;

$R^4$ is $C_1$-$C_5$ alkyl or $C_2$-$C_5$ alkenyl;

$R^5$ and $R^6$ are each independently hydrogen, $C_1$-$C_5$ alkyl or $C_2$-$C_5$ alkenyl; and $R^7$ is $C_1$-$C_5$ alkyl or $C_2$-$C_5$ alkenyl.

3. The silylcyclodisilazane compound of claim 1, wherein the silylcyclodisilazane compound is selected from the following compounds:

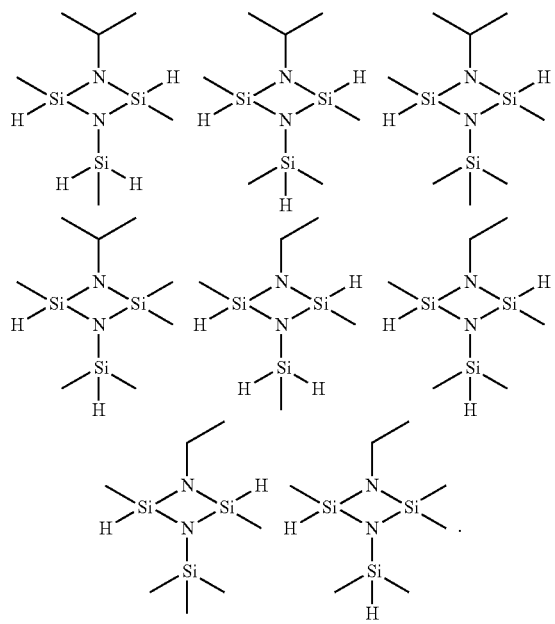

4. A composition for depositing a silicon-containing thin film containing a silylcyclodisilazane compound represented by the following Formula 2:

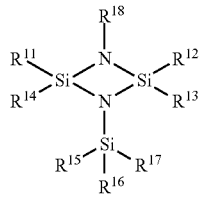

Formula 2 wherein $R^{11}$ to $R^{17}$ are each independently hydrogen, $C_1$-$C_7$ alkyl, $C_3$-$C_7$ cycloalkyl or $C_2$-$C_7$ alkenyl;

$R^{18}$ is hydrogen, $C_1$-$C_7$ alkyl, $C_3$-$C_7$ cycloalkyl, $C_2$-$C_7$ alkenyl or —Si$R^a R^b R^c$; and $R^a$, $R^b$ and $R^c$ are each independently hydrogen, $C_1$-$C_7$ alkyl, $C_3$-$C_7$ cycloalkyl or $C_2$-$C_7$ alkenyl;

provided that when $R^{11}$ to $R^{14}$ are all $C_1$-$C_7$ alkyl, $R^{18}$ is not —Si$R^a R^b R^c$.

5. The composition for depositing a silicon-containing thin film of claim 4, wherein $R^{11}$ and $R^{13}$ are each independently $C^1$-$C_7$ alkyl or $C_2$-$C_7$ alkenyl;

$R^{12}$ and $R^{14}$ are each independently hydrogen, $C_1$-$C_7$ alkyl or $C_2$-$C_7$ alkenyl;

$R^{15}$ is $C_1$-$C_7$ alkyl or $C_2$-$C_7$ alkenyl;

$R^{16}$ and $R^{17}$ are each independently hydrogen, $C_1$-$C_7$ alkyl or $C_2$-$C_7$ alkenyl; and $R^{18}$ is $C_1$-$C_7$ alkyl or $C_2$-$C_7$ alkenyl.

6. The composition for depositing a silicon-containing thin film of claim 4, wherein $R^{11}$ and $R^{13}$ are each independently $C_1$-$C_7$ alkyl or $C_2$-$C_7$ alkenyl;

$R^{12}$ is hydrogen, $C_1$-$C_7$ alkyl or $C_2$-$C_7$ alkenyl;

$R^{14}$ is hydrogen;

$R^{15}$ is $C_1$-$C_7$ alkyl or $C_2$-$C_7$ alkenyl;

$R^{16}$ and $R^{17}$ are each independently hydrogen, $C_1$-$C_7$ alkyl or $C_2$-$C_7$ alkenyl;

$R^{18}$ is —SiR$^a$R$^b$R$^c$;

R$^a$ is $C_1$-$C_7$ alkyl or $C_2$-$C_7$ alkenyl; and

R$^b$ and R$^c$ are each independently hydrogen, $C_1$-$C_7$ alkyl or $C_2$-$C_7$ alkenyl.

7. The composition for depositing a silicon-containing thin film of claim 4, wherein the silylcyclodisilazane compound is selected from the following compounds:

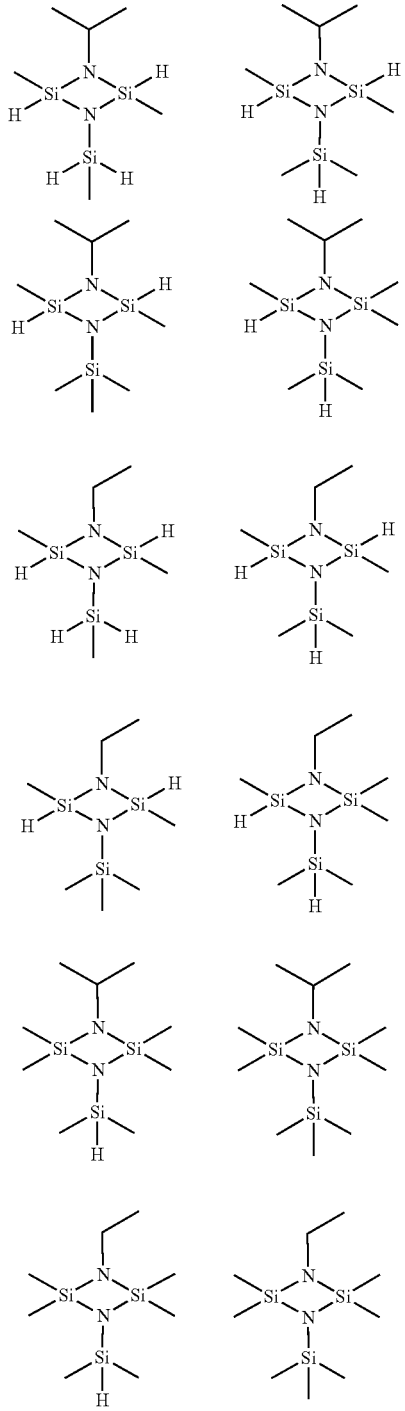

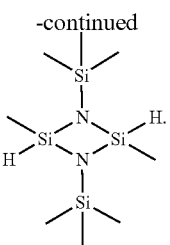

8. A method for manufacturing a silicon-containing thin film using the composition for depositing a silicon-containing thin film of claim 4.

9. The method for manufacturing a silicon-containing thin film of claim 8, wherein the method is performed by atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD), or plasma-enhanced atomic layer deposition (PEALD).

10. The method for manufacturing a silicon-containing thin film of claim 8, wherein the silicon-containing thin film is a silicon oxide (SiO$_2$) film, a silicon oxycarbide (SiOC) film, a silicon nitride (SiN) film, a silicon oxynitride (SiON) film, a silicon carbonitride (SiCN) film, or a silicon carbide (SiC) film.

11. The method for manufacturing a silicon-containing thin film of claim 8, the method comprising:
 a) heating and maintaining a temperature of a substrate mounted in a chamber to 30 to 400° C.;
 b) contacting the substrate with a composition for depositing a silicon-containing thin film on the substrate; and
 c) injecting reaction gas to deposit a silicon-containing thin film on the substrate.

12. A method for manufacturing a silicon-containing thin film using a silylcyclodisilazane compound represented by the following Formula 2:

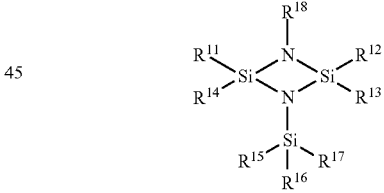

Formula 2 wherein $R^{11}$ to $R^{17}$ are each independently hydrogen, $C_1$-$C_7$ alkyl, $C_3$-$C_7$ cycloalkyl or $C_2$-$C_7$ alkenyl;

$R^{18}$ is hydrogen, $C_1$-$C_7$ alkyl, $C_3$-$C_7$ cycloalkyl, $C_2$-$C_7$ alkenyl or —SiR$^a$R$^b$R$^c$; and R$^a$, R$^b$ and R$^c$ are each independently hydrogen, $C_1$-$C_7$ alkyl, $C_3$-$C_7$ cycloalkyl or $C_2$-$C_7$ alkenyl;

provided that when $R^{11}$ to $R^{14}$ are all $C_1$-$C_7$ alkyl, $R^{18}$ is not —SiR$^a$R$^b$R$^c$.

13. The method for manufacturing a silicon-containing thin film of claim 12, wherein the method is performed by atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD), or plasma-enhanced atomic layer deposition (PEALD).

14. The method for manufacturing a silicon-containing thin film of claim 12, wherein the silicon-containing thin film is a silicon oxide ($SiO_2$) film, a silicon oxycarbide (SiOC) film, a silicon nitride (SiN) film, a silicon oxynitride (SiON) film, a silicon carbonitride (SiCN) film, or a silicon carbide (SiC) film.

* * * * *